United States Patent
Ihs

(10) Patent No.: US 10,798,507 B2
(45) Date of Patent: Oct. 6, 2020

(54) CAPACITIVE MEMS MICROPHONE WITH BUILT-IN SELF-TEST

(71) Applicant: Hassan Ihs, San Diego, CA (US)

(72) Inventor: Hassan Ihs, San Diego, CA (US)

(73) Assignee: Chaoyang Semiconductor Jiangyin Technology Co., Ltd., Jiangyin (CN)

( * ) Notice: Subject to any disclaimer, the term of this patent is extended or adjusted under 35 U.S.C. 154(b) by 0 days.

(21) Appl. No.: 16/536,278

(22) Filed: Aug. 8, 2019

(65) Prior Publication Data

US 2020/0053496 A1    Feb. 13, 2020

Related U.S. Application Data

(60) Provisional application No. 62/715,970, filed on Aug. 8, 2018.

(51) Int. Cl.
| | |
|---|---|
| H04R 29/00 | (2006.01) |
| H03F 3/183 | (2006.01) |
| H03G 3/30 | (2006.01) |
| H03M 1/66 | (2006.01) |
| H03M 1/12 | (2006.01) |
| H04R 1/04 | (2006.01) |

(52) U.S. Cl.
CPC .......... *H04R 29/004* (2013.01); *H03F 3/183* (2013.01); *H03G 3/3005* (2013.01); *H03M 1/12* (2013.01); *H03M 1/66* (2013.01); *H04R 1/04* (2013.01)

(58) Field of Classification Search
CPC .......... H04R 29/00; H04R 1/06; H03M 1/66; H03M 1/12; H03F 3/183; H03G 3/30
USPC ..................................... 381/56, 58
See application file for complete search history.

(56) References Cited

U.S. PATENT DOCUMENTS

| | | | | |
|---|---|---|---|---|
| 2003/0235315 | A1* | 12/2003 | Reesor | H04R 1/04 |
| | | | | 381/115 |
| 2008/0219474 | A1* | 9/2008 | Deruginsky | H02M 3/073 |
| | | | | 381/111 |
| 2011/0110536 | A1* | 5/2011 | Hovesten | H04R 19/04 |
| | | | | 381/111 |
| 2013/0044898 | A1* | 2/2013 | Schultz | H04R 3/06 |
| | | | | 381/111 |
| 2014/0064523 | A1 | 3/2014 | Kropfitsch et al. | |
| 2015/0110295 | A1 | 4/2015 | Jenkner et al. | |

(Continued)

FOREIGN PATENT DOCUMENTS

| | | |
|---|---|---|
| KR | 10-2013-0116812 A | 10/2013 |
| KR | 10-2016-0123364 A | 10/2016 |

OTHER PUBLICATIONS

International Search Report on related PCT Application No. PCT/US2019/045810 from International Searching Authority (KIPO) dated Jan. 13, 2020.

(Continued)

*Primary Examiner* — Melur Ramakrishnaiah
(74) *Attorney, Agent, or Firm* — Klein, O'Neill & Singh, LLP

(57) ABSTRACT

A digital microphone includes built-in self-test features. The features may include capability to apply different bias voltages to a MEMS capacitor sensor of the digital microphone, simulating application of different sound pressures to the digital microphone. The features may also include a digital oscillator, for applying a test signal to an analog front end of the microphone.

20 Claims, 7 Drawing Sheets

(56) References Cited

U.S. PATENT DOCUMENTS

2016/0183008 A1\* 6/2016 Kropfitsch ............ H02M 3/073
  381/113
2017/0238108 A1\* 8/2017 Muza ................... H04R 19/005
  381/58
2017/0280262 A1 9/2017 Tu et al.

OTHER PUBLICATIONS

Written Opinion on related PCT Application No. PCT/US2019/045810 from International Searching Authority (KIPO) dated Jan. 13, 2020.

\* cited by examiner

CAPACITIVE MEMS MICROPHONE WITH BUILT-IN SELF-TEST

CROSS REFERENCE TO RELATED APPLICATION

This application claims the benefit of the filing date of U.S. Provisional Patent Application No. 62/715,970, filed on Aug. 8, 2018, the disclosure of which is incorporated by reference herein.

BACKGROUND OF THE INVENTION

The present invention relates generally to digital microphones, and more particularly to digital microphones with built-in self-test capabilities.

Digital microphones may be used in devices providing for voice recognition or operation by way of voice commands. These devices may include those commonly associated with voice communications, such as cellular phones, particularly phones that may be classified as smart phones. But the devices may also include devices not usually associated with voice operations, for example devices such as televisions, refrigerators, or other household devices. The devices may also include relatively new devices, such as those providing interfaces to virtual assistants.

Many of these devices operate using integrated circuitry. The integrated circuitry performs a variety of operations, including processing of signals provided by microphones of the digital microphones, along with other logic related operations, memory related operations, and possibly communications related operations.

Testing of digital microphones may be complex. As the digital microphones respond to sound, specialized acoustic equipment and setting may generally be used in determining if the digital microphones meet appropriate standards for operation. Unfortunately, such test equipment and settings may be expensive, and use of such equipment and settings may incur time delays and effectively add to the expense of manufacturing and testing the digital microphones. Moreover, the digital microphones generally include, in addition to digital electronics, both mechanical equipment, for example in the form of a MEMS capacitor, and analog electronics. Determining whether it is the mechanical portion or analog electronic portion of the device which does not meet a particular desired standard of operation may be difficult.

BRIEF SUMMARY OF THE INVENTION

In some embodiments a known varying signal is applied to analog electronics of a front end of a digital microphone, with digitized outputs of the analog electronics compared to expected digitized outputs, to determine if differences between the outputs are within acceptable ranges. In some embodiments electrostatic force is applied in a known varying manner to a MEMS capacitor of a digital microphone with outputs of the MEMS capacitor passed through analog electronics of the digital electronics to provide digitized outputs, which are compared to expected digitized outputs, to determine if differences between the outputs are within acceptable ranges.

Some embodiments provide a method of testing a digital microphone, comprising: applying, at different times, a plurality of different bias voltages to a MEMS capacitor of the digital microphone, the MEMS capacitor serving as a sensor for the digital microphone; measuring outputs of an analog front end of the digital microphone resulting from the application of the plurality of different bias voltages to the MEMS capacitor.

Some embodiments provide a digital microphone with built-in self-test, comprising: a MEMS capacitor, the MEMS capacitor serving as a sensor for the digital microphone; at least one charge pump configured to provide a plurality of different bias voltages to the MEMS capacitor; a processing chain comprised of a preamplifier, an analog-to-digital converter (ADC), and a one bit sigma delta block, in series; and a multiplexer configured to pass a signal from the MEMS capacitor to the preamplifier in a first mode and to pass a signal from the sigma delta block in a second mode.

These and other aspects of the invention are more fully comprehended upon review of this disclosure.

DETAILED DESCRIPTION

Figure 1:
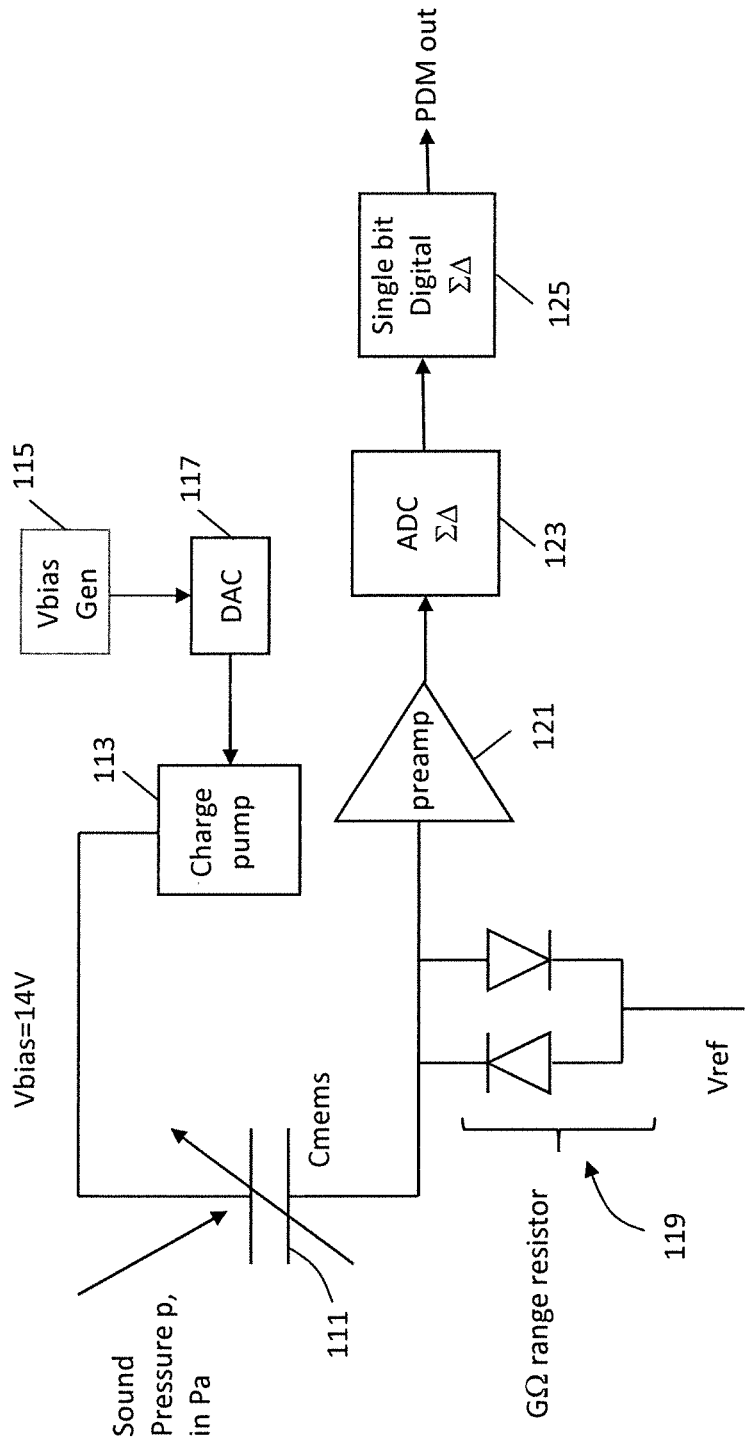
FIG. 1 is a semi-schematic, semi-block diagram of an analog front end (AFE) of a digital microphone.

FIG. 1 is a semi-schematic, semi-block diagram of an analog front end (AFE), including a capacitive sensor, of a digital microphone in accordance with aspects of the invention. In FIG. 1, a MEMS capacitor 111 provides the sensor for a digital microphone. In various embodiments one or more adjustment capacitors (not shown in FIG. 1) may also be coupled to the MEMS capacitor, either in parallel or in series, depending on the implementation. A first side of the MEMS capacitor is coupled to a bias voltage. The bias voltage is provided by a charge pump 113. The bias voltage to be provided by the charge pump is determined by a voltage bias generator 115, which provides a digital signal to a digital-to-analog converter (DAC) 117, which in turn provides an analog control signal to the charge pump.

A second side of the MEMS capacitor is coupled to a reference voltage, through a giga-ohm range resistance in some embodiments, through antiparallel diodes 119 as illustrated in FIG. 1. The second side of the MEMS capacitor provides an input to a processing chain of the digital microphone.

The processing chain of FIG. 1 includes, in sequence, a preamplifier 121, an analog-to-digital converter (ADC) 123, and a single bit digital sigma delta block 125. The preamplifier amplifies the input signal provided by the capacitors.

The ADC converts the amplified signal to a digital signal. In most embodiments the ADC oversamples the amplified signal. The ADC in most embodiments is a sigma-delta ADC, although a delta-sigma ADC or other ADC may be used in some embodiments. The single bit digital sigma delta block provides a pulse density modulated (PDM) output.

Figure 2:
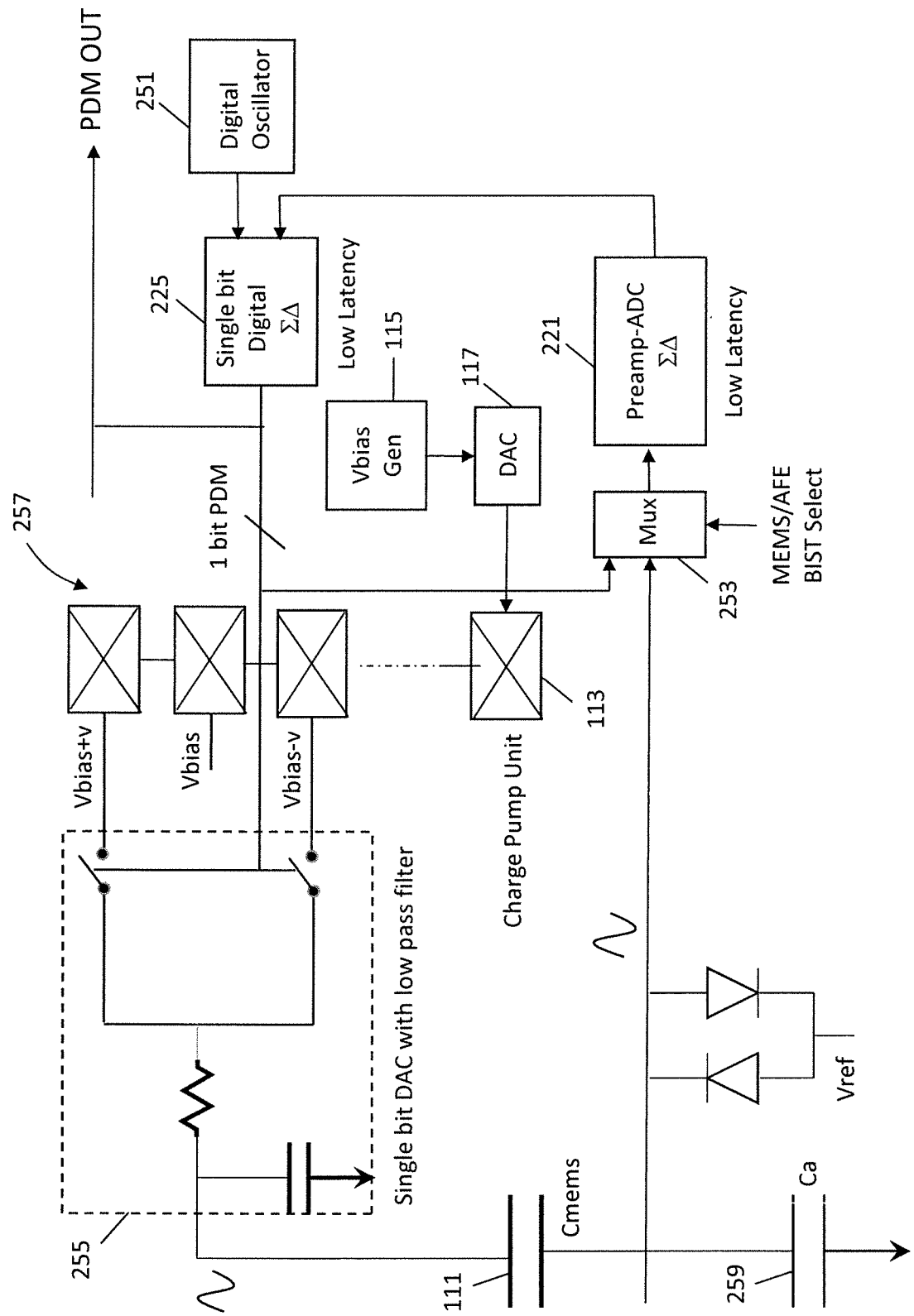
FIG. 2 is a semi-schematic, semi-block diagram of an analog front end (AFE) of a digital microphone including built-in self-test (BIST) elements, in accordance with aspects of the invention.

FIG. 2 is a semi-schematic, semi-block diagram of an analog front end (AFE) of a digital microphone including built-in self-test (BIST) elements, in accordance with aspects of the invention. The embodiment of FIG. 2 is similar to that of FIG. 1, showing for example the MEMS capacitor 111, and charge pump 113, voltage bias generator block 115 and associated DAC 117. The MEMS capacitor is similarly coupled to a preamplifier and ADC, with the preamplifier and ADC shown as a combined preamplifier and ADC block 221 in FIG. 2. Similarly, an output of the preamplifier and ADC block is coupled to a single bit digital sigma delta block 225.

The embodiment of FIG. 2 additionally includes, however, a digital oscillator 251 providing another input to the sigma delta block 225. The digital oscillator may be configured, for example, to provide a variable frequency and/or variable amplitude pure tone signal to the sigma delta block. An output of the sigma delta block is provided to a multiplexer 253. The multiplexer also receives a signal from the MEMS capacitor, with a selector signal to the multiplexer determining whether the multiplexer passes the output of the sigma delta block or the signal from the MEMS capacitor to the preamplifier and ADC block. In some embodiments the selector is passes the output of the sigma delta block to the preamplifier and ADC block during self-test of the analog front end (excluding the sensor), and otherwise passes the signal from the MEMS capacitor. In self-test, the output of the sigma delta block, or in some embodiments an output of the preamplifier and ADC block, may be examined to determine if the analog front end circuitry (excluding the sensor) performs within a desired range of operation.

The output of the sigma delta block is also provided, in self test, to a single bit DAC with low pass filter block 255. In some embodiments the single bit DAC with low pass filter block is configured to provide application of a sine wave to the MEMS capacitor, with an amplitude dependent on amplitude of the signal provided by the digital oscillator. In this regard, the single bit DAC with low pass filter block also receives, from additional charge pump stages 257, voltages slightly above voltage provided by the charge pump 113 and voltages slightly below voltage provided by the charge pump 113.

Application of the voltages creates an electrostatic force between membranes of the MEMS capacitor. During normal operation of a digital microphone, the electrostatic force applied by the normal biasing voltage for the MEMS capacitor, for example 14 Volts, may be considered to indicate no sound pressure. Audible sound pressures may range, for example, from 200 micro Pascals to 200 Pascals. It is believed that modifying the bias voltage by roughly plus or minus 4 volts from a normal bias voltage of 14 volts is sufficient to test the MEMS capacitor. Accordingly, in some embodiments the voltages supplied by the additional charge pump stages ranges from roughly 10 Volts to roughly 18 Volts.

In addition, the embodiment of FIG. 2 includes an attenuation capacitor in series with the MEMS capacitor, with the signal provided to the multiplexer 253 taken from a node between the MEMS capacitor and the attenuation capacitor. The attenuation capacitor is used to create a gain $Cm(1+kPelect)/Ca$ that is a linear function of electrostatic pressure.

Figure 3:
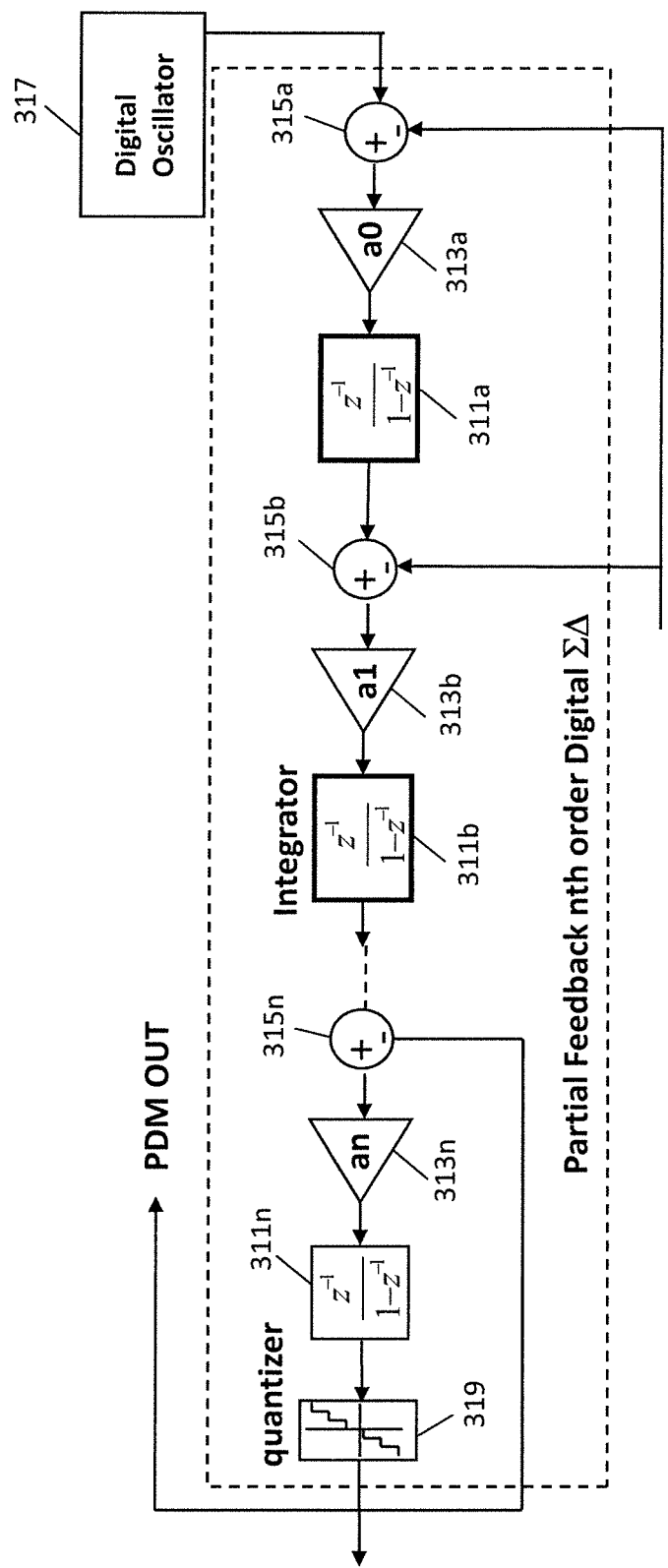
FIG. 3 is a block diagram of an nth order digital sigma delta with partial feedback, for example for use as the single bit digital sigma delta block of FIG. 2, in accordance with aspects of the invention.

Use of the single bit DAC with low pass filter, for example an RC low pass filter, in the embodiment of FIG. 2 may raise loop stability issues. Accordingly, in some embodiments configuration, for example during self-test operations, of the single bit sigma delta block may utilize partial feedback to potentially improve loop stability. FIG. 3 is a block diagram of an nth order digital sigma delta with partial feedback, for example for use as the single bit digital sigma delta block of FIG. 2, at least for use during self-test operations, in accordance with aspects of the invention.

The block includes a plurality of N integrators arranged in a series, with integrators 311$a$, 311$b$, and 311$n$ explicitly shown in FIG. 3. Gain elements 313$a$, 313$b$, and 313$n$ are shown, in the series, preceding each of the integrators. An output of the sigma delta block is quantized by a quantizer 319.

An input to the sigma delta block is provided by the digital oscillator of FIG. 2. In addition, negative feedback, to at least the first one or two integrators, is provided by the preamplifier and ADC block of FIG. 2. In FIG. 3, this negative feedback is shown as being provided to summers 315$a$ and 315$b$, which precede the gain elements 313$a$ and 313$b$, respectively, in the series. Subsequent integrators receive negative feedback from the output of the sigma delta block, with for example this negative feedback being shown as being provided to summer 315$n$, which precedes the gain element 313$n$ in the series.

Figure 4:
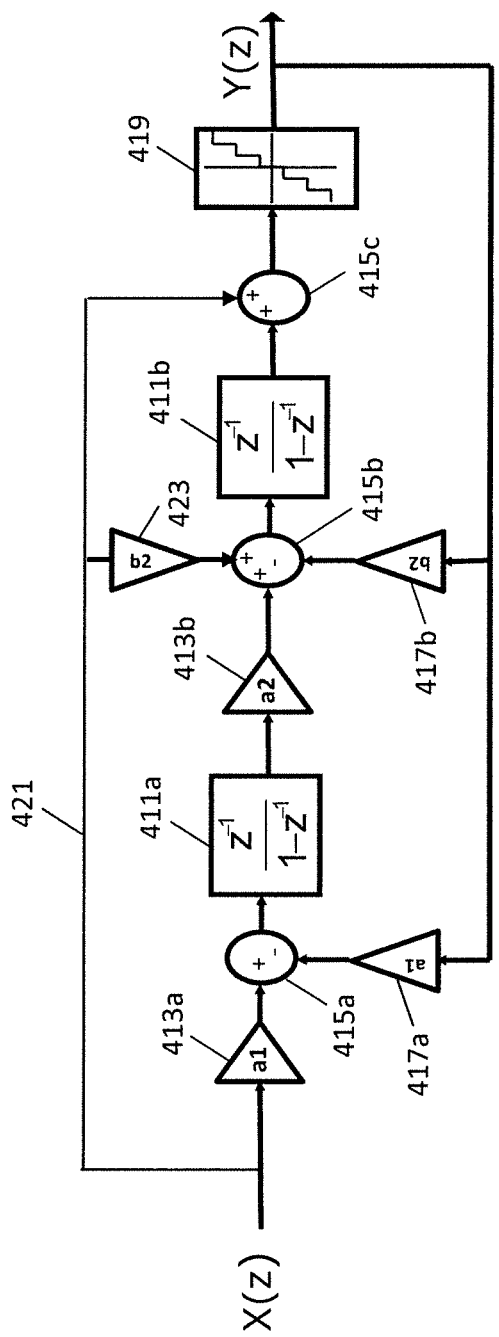
FIG. 4 is a block diagram of an example low latency sigma delta block with feed forward paths for the analog-to-digital converter (ADC) block of FIG. 2, in accordance with aspects of the invention.

Low latency for the sigma delta ADC may also improve loop stability. FIG. 4 is a block diagram of an example low latency sigma delta block with feed forward paths for the analog-to-digital converter (ADC) block of FIG. 2, in accordance with aspects of the invention. The block includes a plurality of integrators arranged in a series, with integrators 411$a$ and 411$b$ explicitly shown in FIG. 4. Gain elements 413$a$ and 413$b$ are shown, in the series, preceding each of the integrators. An output of the sigma delta block is quantized by a quantizer 419. The integrators receive negative feedback from the output of the sigma delta block, with for example this negative feedback being shown as being provided to summers 415$a$ and 415$b$, which are shown as between the gain elements and corresponding integrators. In FIG. 4 the negative feedback is also shown as being scaled by gain elements 417$a$ and 417$b$, respectively.

The sigma delta block also includes a feed-forward path 421. In addition to being provided as a scaled input to the first integrator 411$a$, the input to the block is fed to the summers for the other integrators, for example integrator 411$b$, with a scaling indicated as the same as that of the corresponding negative feedback. Further, the feed-forward path also provides in input to a further summer 415$c$, immediately prior to the quantizer.

Figure 5:
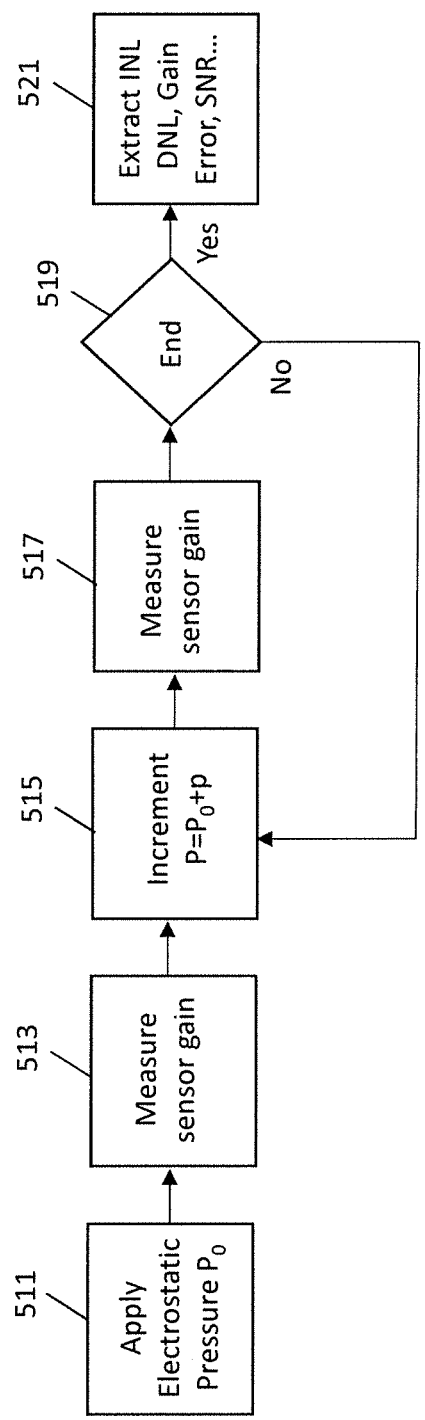
FIG. 5 is a flow diagram of a process for characterizing a sensor and analog front end of a digital microphone, in accordance with aspects of the invention.

FIG. 5 is a flow diagram of a process for characterizing a sensor and analog front end of a digital microphone, in accordance with aspects of the invention. In some embodiments the process of FIG. 5 is performed after performing a self-test of analog front end excluding the sensor. In some embodiments the process is performed by a digital microphone. In some embodiments the process is performed by the digital microphone of FIG. 2.

In block 511 an initial electrostatic pressure is applied to a MEMS capacitor of the digital microphone. In some embodiments the electrostatic pressure is applied by applying a bias voltage to the MEMS capacitor. In some embodiments the MEMS capacitor is in series with an adjustment capacitor, with an output of the MEMS capacitor being taken from a node between the MEMS capacitor and the adjustment capacitor.

In block 513 the process measures initial sensor gain with the initial electrostatic pressure applied to the MEMS capacitor. In some embodiments sensor gain is measured by passing the output of the MEMS capacitor through analog electronics of the digital microphone. In some embodiments the sensor gain is measured by an ADC block of the digital microphone. In some embodiments the sensor gain is measured by a block providing a PDM output of the digital microphone.

In block 515 the process varies the electrostatic pressure applied to the MEMS capacitor. In some embodiments the process increments a value associated with electrostatic pressures, and uses the value to determine a new electrostatic pressure to apply to the MEMS capacitor.

In block 517 the process measures sensor gain with the new electrostatic pressure applied to the MEMS capacitor. In some embodiments sensor gain is measured by passing the output of the MEMS capacitor through analog electronics of the digital microphone. In some embodiments the sensor gain is measured by an ADC block of the digital microphone. In some embodiments the sensor gain is measured by a block providing a PDM output of the digital microphone.

Figure 6:
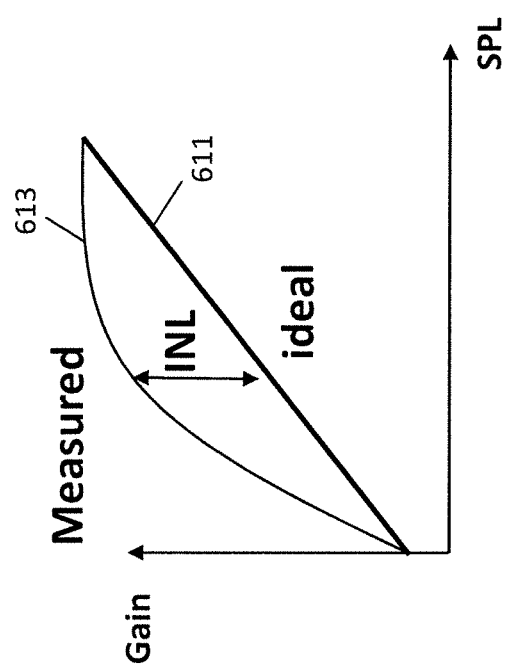
FIG. 6 is a chart showing measured versus ideal gain for a sensor.

In some embodiments a chart such as the chart of FIG. 6 may be generated, based on a plurality of measurements. The chart of FIG. 6 shows gain versus sound pressure levels for an ideal MEMS capacitor with respect to possible measurements for an actual MEMS capacitor. In the chart of FIG. 6, the gain and sound pressure levels increase by a constant ratio for a line 613 indicative for the ideal MEMS capacitor. For a possible actual MEMS capacitor, however, a line 611 indicative of measured results may vary from the ideal.

In block 519 the process determines if more measurements are to be made. In some embodiments more measurements are to be made if the value associated with electronic pressures is less than a predetermined value. If more measurements are to be made, the process returns to operations of block 515. If not, the process proceeds to operations of block 521.

In block 521 various metrics are extracted or determine from the measured information. For example, in some embodiments signal-to-noise ratio, gain error, and other information may be extracted or determined.

Figure 7:
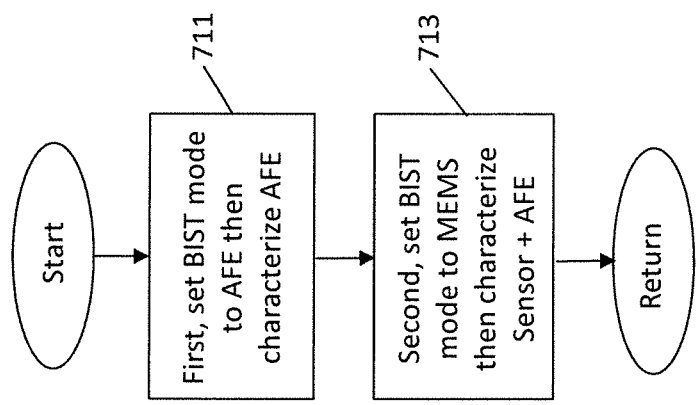
FIG. 7 is a flow diagram of a process for conducting BIST for digital microphone front end, in accordance with aspects of the invention.

FIG. 7 is a flow diagram of a process for conducting BIST for digital microphone front end, in accordance with aspects of the invention. In some embodiments the process is performed by a digital microphone. In some embodiments the process is performed by the digital microphone of FIG. 2.

In block 711 a BIST mode is set to test an analog front end, excluding the sensor, of the digital microphone, and the analog front end is tested. In some embodiments the test is performed by applying a known signal generated by an oscillator, of or associated with the digital microphone, to an element of the analog front end. In some embodiments the element is a sigma delta block of the analog front end. In some embodiments output of the analog front end, due to the application of the known signal, is compared against a desired or expected output. In some embodiments signal to noise ratio and total harmonic distortion is determined for the analog front end by performing the test.

In block 713 the BIST mode is set to test a MEMS capacitor, and the sensor and analog front end is tested. In some embodiments various bias voltages are applied to the MEMS capacitor, and output of the analog front end is considered. In some embodiments operations of block 713 include the process of FIG. 5.

The process thereafter returns.

Although the invention has been discussed with respect to various embodiments, it should be recognized that the invention comprises the novel and non-obvious claims supported by this disclosure.

What is claimed is:

1. A method of testing a digital microphone, comprising:
   applying, at different times, a plurality of different bias voltages to a MEMS capacitor of the digital microphone, the MEMS capacitor serving as a sensor for the digital microphone, the digital microphone including a preamplifier, an analog-to-digital converter (ADC), and a sigma delta block, arranged in a sequence;
   measuring outputs of an analog front end of the digital microphone resulting from the application of the plurality of different bias voltages to the MEMS capacitor; and
   applying a digital oscillation signal to an element of the analog front end of the digital microphone, and measuring an output of the analog front end;
   wherein the digital oscillation signal is applied as an input to the sigma delta block, and the sigma delta block receives a negative feedback signal from the ADC.

2. The method of claim 1, wherein the different bias voltages are applied using a single bit digital-to-analog converter (DAC).

3. The method of claim 2, wherein the single bit DAC includes a low pass filter.

4. The method of claim 3, wherein the sigma delta block comprises an nth order digital sigma delta block with partial feedback.

5. The method of claim 4, wherein the ADC comprises a sigma delta block with feed forward paths, a plurality of integrators arranged in a series, and negative feedback paths.

6. The method of claim 1, wherein an attenuation capacitor is coupled in series with the MEMS capacitor, for purposes of creating a gain that is a linear function of electrostatic pressure.

7. The method of claim 1 wherein the digital oscillation signal is applied to the element of the analog front end during a test, with a signal from the sigma delta block applied to the preamplifier during the test.

8. The method of claim 1, wherein the sigma delta block comprises an nth order digital sigma delta block with partial feedback.

9. The method of claim 1, wherein the ADC comprises a sigma delta block with feed forward paths, a plurality of integrators arranged in a series, and negative feedback paths.

10. A digital microphone with built-in self-test, comprising:
    a MEMS capacitor, the MEMS capacitor serving as a sensor for the digital microphone;
    at least one charge pump configured to provide a plurality of different bias voltages to the MEMS capacitor;
    a processing chain comprised of a preamplifier, an analog-to-digital converter (ADC), and a one bit sigma delta block, in series; and
    a multiplexer configured to pass a signal from the MEMS capacitor to the preamplifier in a first mode and to pass a signal from the sigma delta block in a second mode.

11. The digital microphone of claim 10, further comprising an attenuation capacitor coupled in series with the MEMS capacitor.

12. The digital microphone of claim 11, further comprising a single bit digital-to-analog converter (DAC) with low pass filter, coupling the at least one charge pump and the MEMS capacitor.

13. The digital microphone of claim 12, further comprising a digital oscillator, the digital oscillator configured to generate signals at different frequencies and with different amplitudes, the digital oscillator coupled to an input of the one bit sigma delta block.

14. The digital microphone of claim 13, wherein an output of the one bit sigma delta block is coupled to the single bit DAC.

15. The digital microphone of claim 12, wherein the one bit sigma delta block comprises an nth order digital sigma delta block with partial feedback.

16. The digital microphone of claim 15, wherein the nth order digital sigma delta block includes a plurality of integrators arranged in a sequence.

17. The digital microphone of claim 15, wherein the ADC comprises a sigma delta block with feed forward paths, a plurality of integrators arranged in a series, and negative feedback paths.

18. The digital microphone of claim 10, wherein the one bit sigma delta block comprises an nth order digital sigma delta block with partial feedback.

19. The digital microphone of claim 18, wherein the nth order digital sigma delta block includes a plurality of integrators arranged in a sequence.

20. The digital microphone of claim 10, wherein the ADC comprises a sigma delta block with feed forward paths, a plurality of integrators arranged in a series, and negative feedback paths.

* * * * *